United States Patent
Sun et al.

(10) Patent No.: US 7,570,115 B2
(45) Date of Patent: Aug. 4, 2009

(54) COMMON MODE VOLTAGE EXTRACTION CIRCUIT

(75) Inventors: Ye Hui Sun, Shanghai (CN); Jiang Li Xin, Shanghai (CN)

(73) Assignee: Integrated Device Technology, Inc, San Jose, CA (US)

( * ) Notice: Subject to any disclaimer, the term of this patent is extended or adjusted under 35 U.S.C. 154(b) by 0 days.

(21) Appl. No.: 11/904,803

(22) Filed: Sep. 28, 2007

(65) Prior Publication Data
US 2009/0085662 A1    Apr. 2, 2009

(51) Int. Cl.
*H03F 3/45*  (2006.01)

(52) U.S. Cl. .................................... 330/258

(58) Field of Classification Search ............. 330/258, 330/259

See application file for complete search history.

(56) References Cited

U.S. PATENT DOCUMENTS 5,783,934 A * 7/1998 Tran .......................... 323/312

\* cited by examiner

*Primary Examiner*—Robert Pascal
*Assistant Examiner*—Khiem D Nguyen
(74) *Attorney, Agent, or Firm*—Finnegan, Henderson, et al.

(57) ABSTRACT

Consistent with the present invention, there is provided a circuit for extracting a common mode voltage of an input signal. The device may include an operational amplifier having an output, at least one negative input and at least one positive input, a first transistor, and a second transistor. A terminal of the first transistor may be coupled to the output of the operational amplifier. A terminal of the second transistor may be coupled to a terminal of the first transistor and the at least one positive input of the operational amplifier to create a negative feedback loop. The device may further include a common mode output, wherein the negative feedback loop extracts the common mode voltage of the input signal, the common mode voltage of the input signal being output at the common mode output. The device consistent with the present invention may provide the common mode voltage of the input signal without using any resistors, and while only occupying a small die area.

14 Claims, 4 Drawing Sheets

COMMON MODE VOLTAGE EXTRACTION CIRCUIT

TECHNICAL FIELD

Consistent with the present invention, there is provided a novel circuit that extracts a common mode voltage from an input signal.

BACKGROUND

In many electrical circuits and components, common mode voltage extraction is a critical step. This is particularly true in circuits such as common mode comparator circuits and signal detector circuits.

FIG. 1 is a graph illustrating a signal having differential modes Out+ and Out−, and a common mode CM. As shown in FIG. 1, the common mode CM is the signal which is common to both differential modes Out+ and Out−.

FIG. 2 illustrates an example of a circuit for extracting a common mode voltage, according to the prior art. As shown in FIG. 2, for example, circuit 100, which may be a driver, is connected to a common mode extraction circuit 120 which extracts the common mode from differential signals Out+ and Out−. Circuit 100 includes resistors 10 and 20 connected to transistors 30 and 40, and is grounded at ground 50. An input signal, comprising differential inputs In+ and In−, is fed into the terminals of transistors 30 and 40. Differential outputs Out+ and Out− are extracted from between transistors 30 and 40 and resistors 10 and 20, and fed into common mode extraction circuit 120.

Common mode extraction circuit 120 comprises resistors 60 and 70 connected in series, and the common mode signal CM is output at common mode output 80. Ignoring the effect of transistors 30 and 40 in FIG. 1, the voltage gain may be derived as $$H(s) = \frac{V_{out}}{V_{in}} = g_{m1} \cdot \left(\frac{R_L \cdot R_C}{R_L + R_C}\right),$$

where $g_{m1}$ is the transfer conductance of transistor 30/transistor 40, $R_L$ is the resistance of resistors 10 and 20, and $R_C$ is the resistance of resistors 60 and 70.

As shown by the equation, the value of the expression in the parentheses decreases as $R_C$ decreases. As a result, the gain of the circuit is also decreased as $R_C$ decreases. In order to avoid this gain degradation, resistors 50 and 60 need to be large. These large resistors occupy a large die area, leading to an increase in cost, and difficulty in integration.

Accordingly, consistent with the present invention, there is provided a novel circuit which may employ a novel method for extracting a common mode voltage from an input signal which does not use resistors. Embodiments consistent with the present invention may use small transistors for extracting a common mode voltage. The smaller transistors occupy a smaller area on a chip than the large resistors, and thus allow for lowered production costs, and increased integration on smaller devices.

BRIEF SUMMARY

Consistent with the present invention, there is provided a device for extracting a common mode voltage of an input signal, comprising an operational amplifier having an output, at least one negative input and at least one positive input, a first transistor, a terminal of the first transistor being operably coupled to the output of the operational amplifier, a second transistor, a terminal of the second transistor being operably coupled to a terminal of the first transistor and the at least one positive input of the operational amplifier to create a negative feedback loop; and a common mode output, wherein the negative feedback loop extracts the common mode voltage of the input signal, the common mode voltage of the input signal being output at the common mode output.

It is to be understood that both the foregoing general description and the following detailed description are exemplary and explanatory only and are not restrictive of the invention, as claimed.

The accompanying drawings, which are incorporated in and constitute a part of this specification, illustrate one (several) embodiment(s) of the invention and together with the description, serve to explain the principles of the invention.

DETAILED DESCRIPTION

Reference will now be made in detail to embodiments consistent with the present invention, examples of which are illustrated in the accompanying drawings. Wherever possible, the same reference numbers will be used throughout the drawings to refer to the same or like parts.

Figure 1:
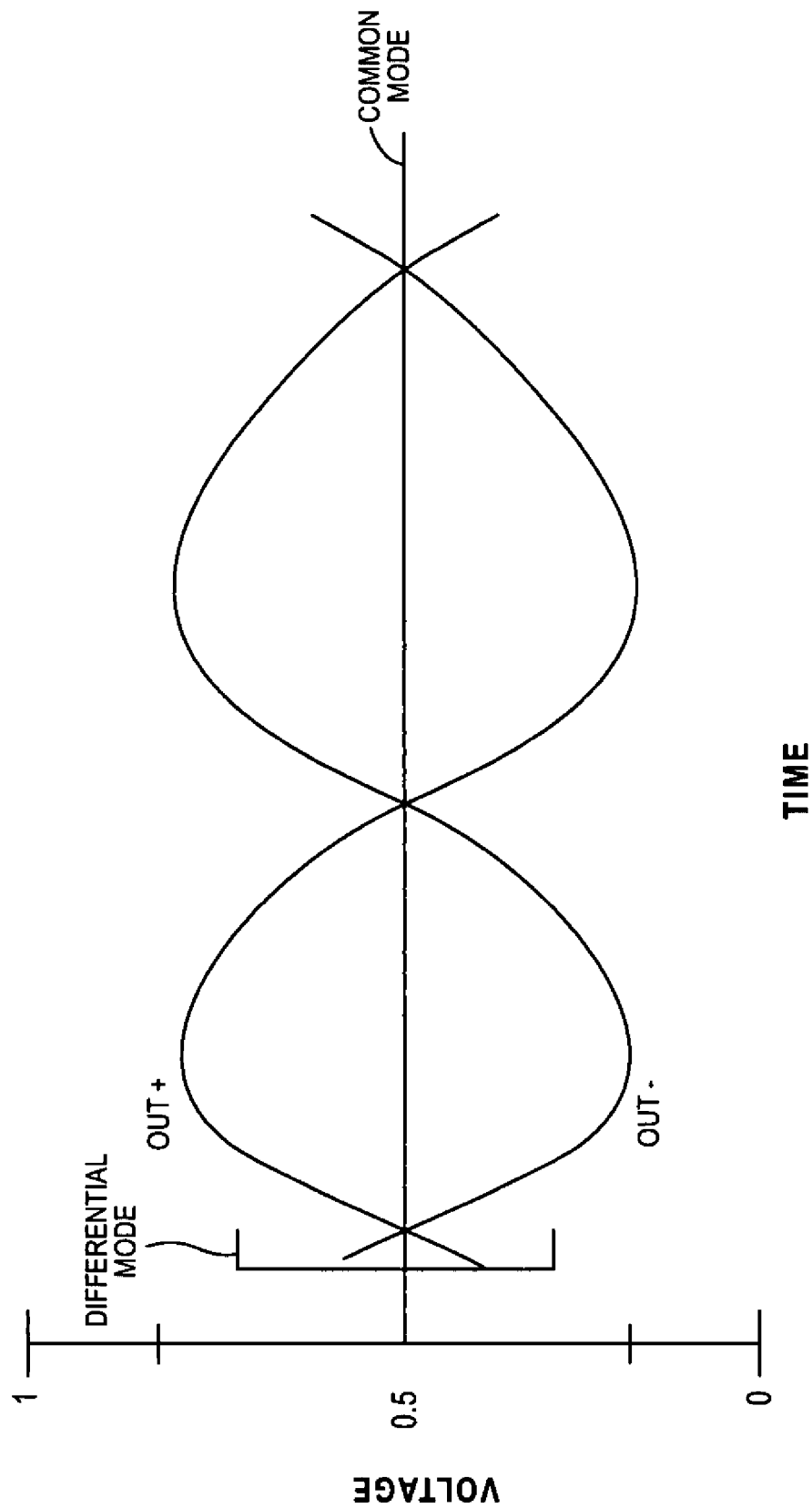
FIG. 1 is a graph illustrating a signal having differential modes Out+ and Out−, and a common mode CM.
Figure 2:
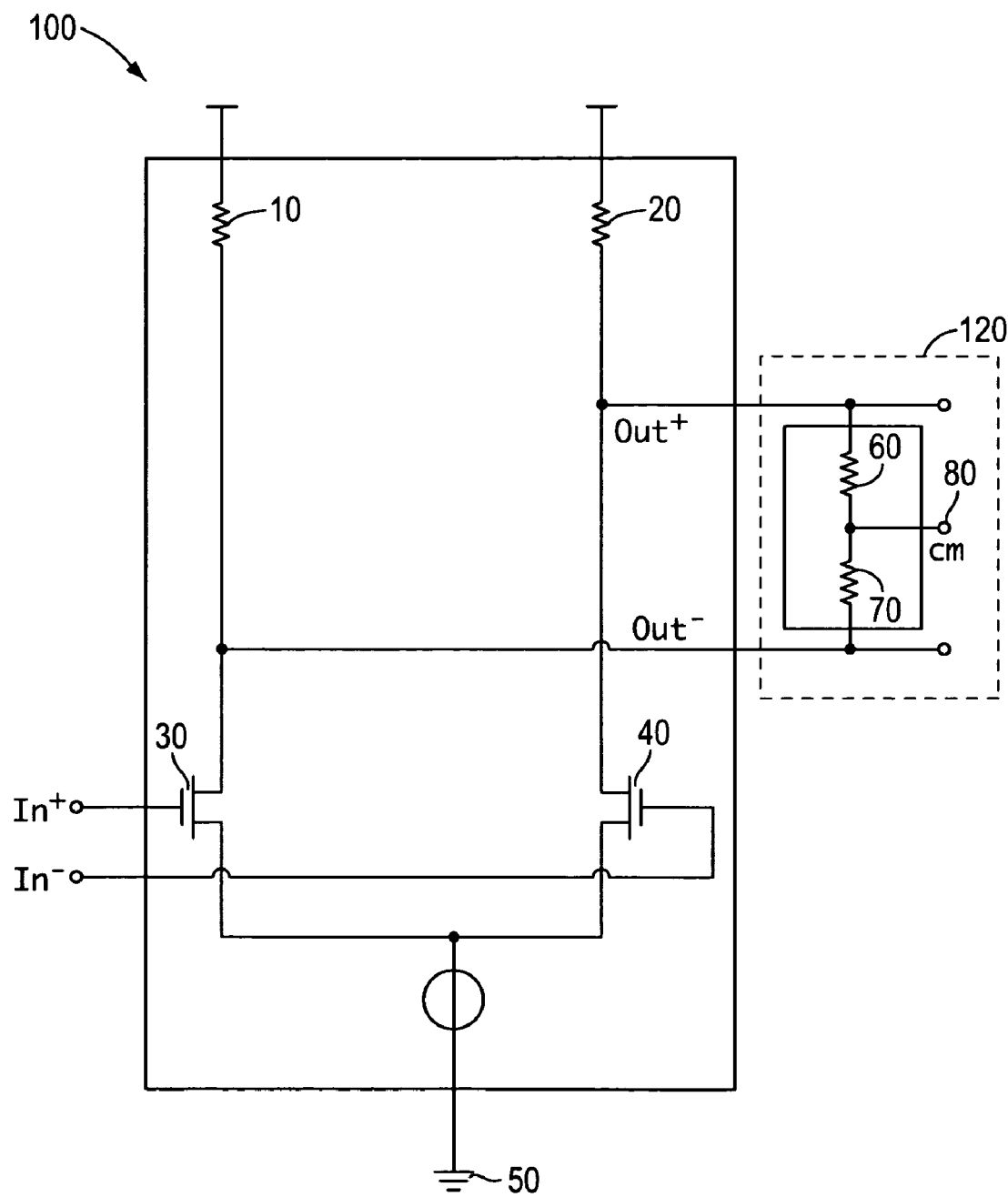
FIG. 2 illustrates an example of a circuit for extracting a common mode voltage, according to the prior art.
Figure 3:
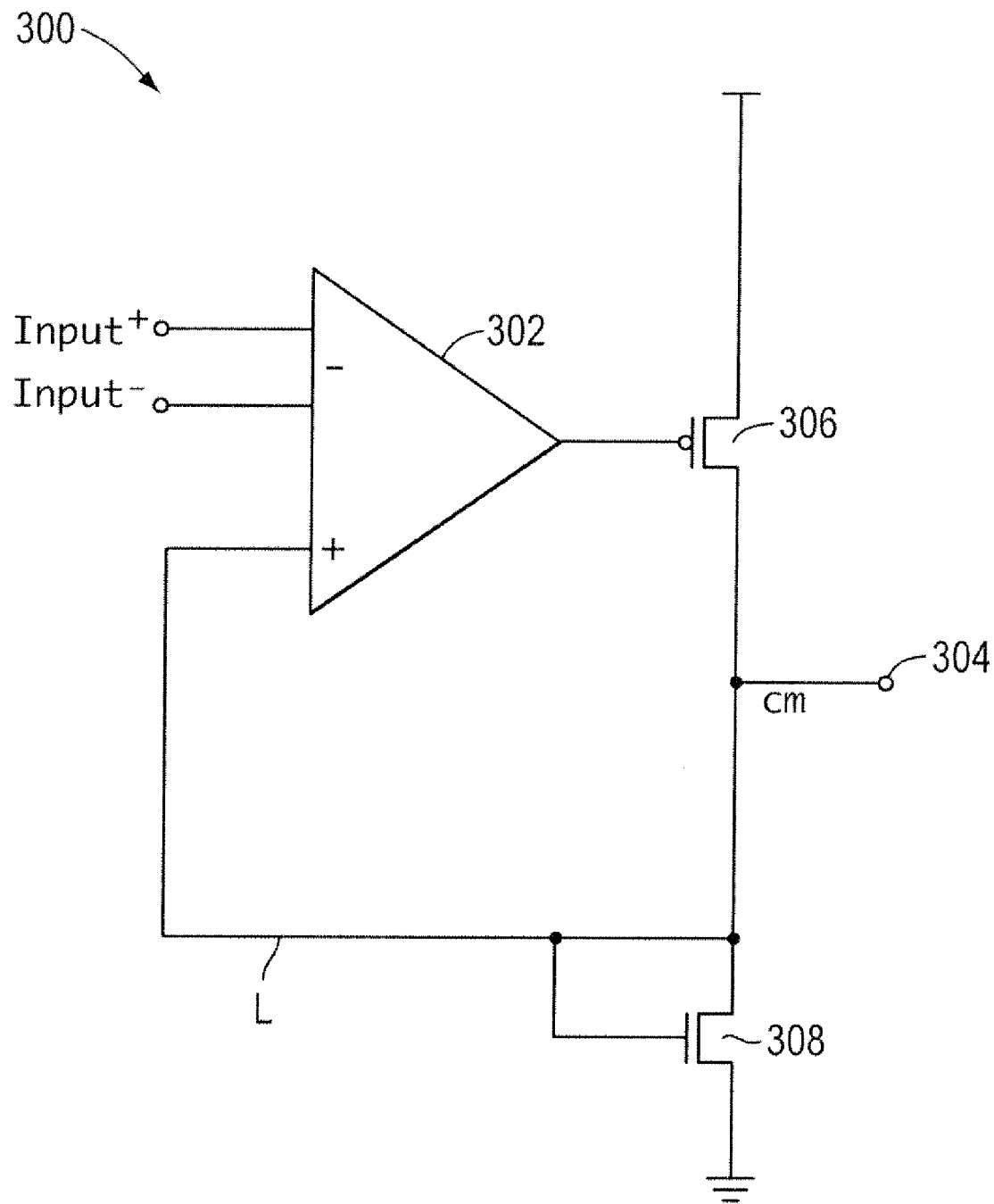
FIG. 3 illustrates a circuit for extracting a common mode voltage from a signal, consistent with the present invention.

FIG. 3 illustrates a circuit for extracting a common mode voltage from a signal, consistent with the present invention. As shown in FIG. 3, circuit 300 employs a negative feedback loop L which includes an operational amplifier 302 having three inputs to extract the common mode of the input signal. Differential portions of the input signal Input+ and Input− are fed into the negative input of operational amplifier 302. The common mode voltage CM is determined at common mode voltage node 304. Common mode voltage node 304 is coupled to the positive input of operational amplifier 302. Consistent with the present invention, circuit 300 may be integrated into a larger integrated circuit.

Circuit 300 further includes transistors 306 and 308. Transistors 306 and 308 may be bipolar transistors, field effect transistors (FETs), metal-oxide-semiconductor (MOS) transistors, or any other suitable type of transistor. Consistent with an embodiment of the present invention, transistors 306 and 308 are FET transistors, transistor 306 being a P-type FET, and transistor 308 being an N-type FET. Transistor 306 is coupled to the output of operational amplifier 302, such that the output of operational amplifier 302 is fed into a terminal of transistor 306. A terminal of transistor 306 is fed into a terminal of transistor 308, and into positive input of operational amplifier 302, forming negative feedback loop L. A terminal of transistor 308 is also coupled to ground.

Figure 4:
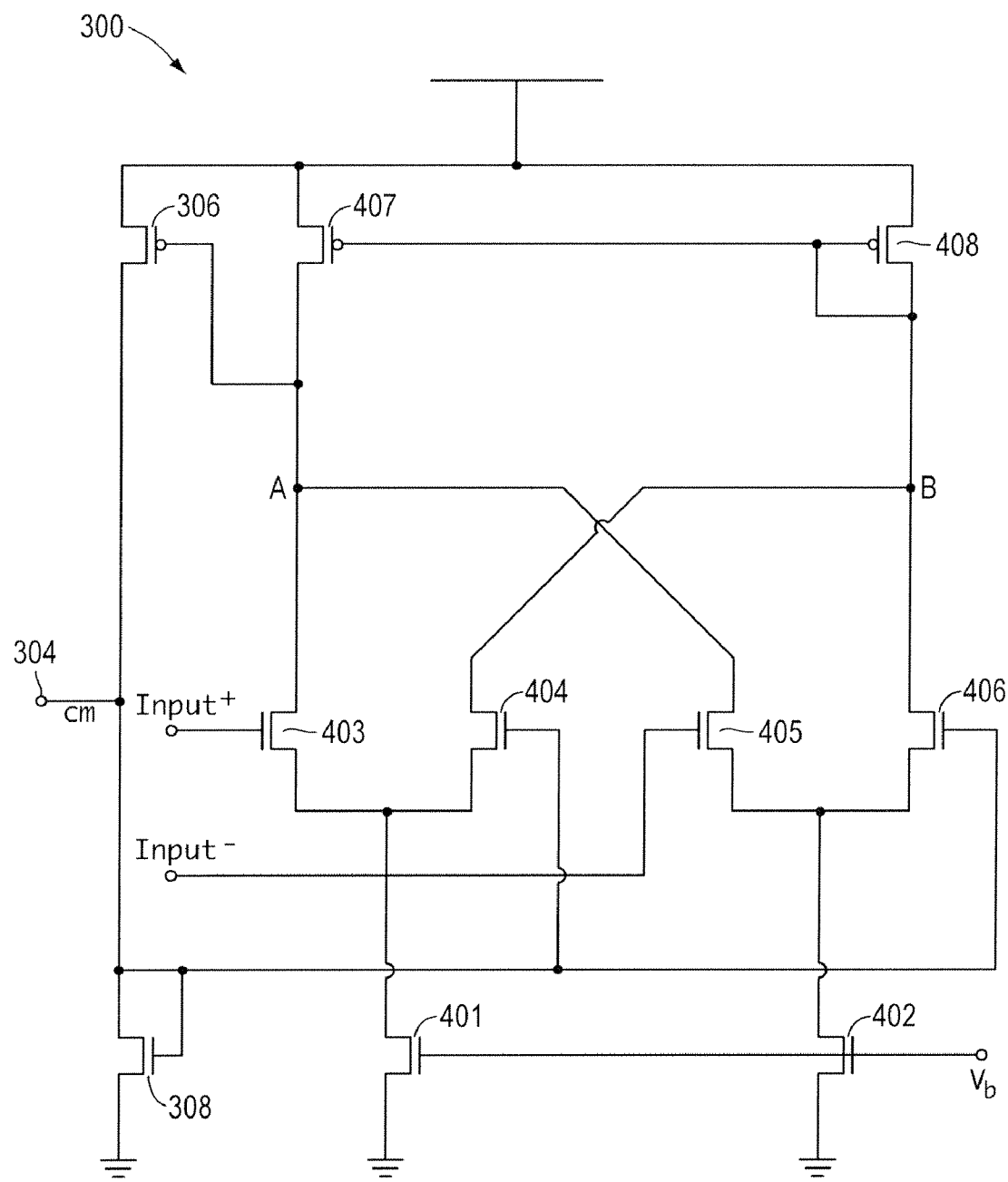
FIG. 4 illustrates the circuit for extracting a common mode voltage in greater detail.

FIG. 4 illustrates circuit 300 in greater detail. Specifically, FIG. 4 illustrates operational amplifier 302 as an interconnection of transistors 401-408. Transistors 401 and 402 are coupled to a base voltage $V_b$. Transistors 401 and 402 each act as a load on base voltage $V_b$ causing a current I to be input into transistors 403, 404, 405, and 406. Transistors 401 and 402 may be bipolar transistors, field effect transistors (FETs), metal-oxide-semiconductor (MOS) transistors, or any other suitable type of transistor. Consistent with an embodiment of the present invention, transistors 401 and 402 are n-type FET transistors.

Input signal Input+ and Input− are fed into terminals of transistors 403 and 405. Transistors 403 and 405 act as a load on the differential voltage, creating a current which is summed at node A. The differential mode components of Input+ and Input− cancel each other out at node A, such that the common mode remains. The common mode voltage can thus be extracted at common mode voltage node 304.

A current is created across transistors 404 and 406, which is summed at node B. Transistor pair 407 and 408 act as a current mirror for transistors 403-406. Thus, the currents at node A should be equal to the current at node B, and the currents across the individual transistors 403-406, when summed, would equal 2 times the current at node A or node B. That is, $I_{403}+I_{404}+I_{405}+I_{406}=2I$.

To describe the overall operation of circuit 300, assume that at t=0, a common mode voltage $V_{CM}$ is equal to $$\left(\frac{V_{Input+} + V_{Input-}}{2}\right).$$

If the voltage of input signal Input+ and Input− ($V_{Input+}$ and $V_{Input-}$), for example, is decreased, then, according to Ohm's Law, current $I_{403}$ and $I_{405}$ is also decreased. However, because $I_{403}+I_{404}+I_{405}+I_{406}=2I$, currents $I_{404}$ and $I_{406}$ are increased to compensate for the decrease in currents $I_{403}$ and $I_{405}$. Thus, the summed current at node B is larger than the current at node A. Because the current mirror comprising transistor pair 407 and 408 mirrors the current at node B, the current across transistor 407 would increase, in order to increase the current at node A. As the current increases at node A, the voltage at node A also increases. The increase in voltage at node A, in turn, leads to a decrease in current at transistor 306 ($I_{306}$). This leads to a decrease in common mode voltage $V_{CM}$ at common mode voltage node 304. Consistent with the present invention, common mode voltage $V_{CM}$ will decrease continuously until $$V_{CM} = \left(\frac{V_{Input+} + V_{Input-}}{2}\right).$$

further consistent with the present invention, circuit 300 would respond similarly for an increase in the voltage of input signal Input+ and Input− ($V_{Input+}$ and $V_{Input-}$), such that common mode voltage $V_{CM}$ would increase continuously until $$V_{CM} = \left(\frac{V_{Input+} + V_{Input-}}{2}\right).$$

Thus, the voltage output at common mode voltage node 304 will always be the common mode voltage of input signal Input+ and Input−.

Transistors 403-408 may be bipolar transistors, field effect transistors (FETs), metal-oxide-semiconductor (MOS) transistors, or any other suitable type of transistor. Consistent with an embodiment of the present invention, transistors 403-408 are FET transistors, transistors 403-406 being n-type FET transistors, and transistors 407 and 408 being p-type FET transistors.

Consistent with the present invention, circuit 300 primarily comprises only ten transistors, and no resistors. Thus circuit 300 may occupy a small die area, and allow for integration in smaller devices. Moreover, because common mode voltage $V_{CM}$ is typically a low-frequency signal, the operating bandwidth of circuit 306 does not have to be large. Therefore circuit 300 consumes very little power.

Other embodiments consistent with the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A device for extracting a common mode voltage of an input signal, comprising:
   an operational amplifier having an output, at least one negative input and at least one positive input;
   a first transistor, a first terminal of the first transistor being operably coupled to the output of the operational amplifier;
   a second transistor, a terminal of the second transistor being operably coupled to a second terminal of the first transistor and the at least one positive input of the operational amplifier to create a negative feedback loop;
   third and fourth transistors, a first terminal of the third transistor and a first terminal of the fourth transistor both being operably coupled to the at least one negative input; and
   a common mode output, wherein the negative feedback loop extracts the common mode voltage of the input signal, the common mode voltage of the input signal being output at the common mode output.

2. The device of claim 1, wherein the operational amplifier further comprises:
   a current mirror.

3. The device of claim 2, wherein a second terminal of the third transistor is operably coupled to a second terminal of the fourth transistor at a first node.

4. The device of claim 3, further comprising:
   a fifth transistor and a sixth transistor, a first terminal of the fifth transistor being operably coupled to a first terminal of the sixth transistor at a second node.

5. The device of claim 4, wherein the current mirror comprises a seventh transistor and an eighth transistor, a first terminal of the seventh transistor being operably coupled to the first node, and a first terminal of the eighth transistor being operably coupled to the second node.

6. The device of claim 5, wherein the operational amplifier further comprises:
   a ninth transistor and a tenth transistor each having a first terminal coupled to a power supply voltage and a second terminal being coupled to ground, wherein, the ninth transistor and tenth transistor act as a load on the power supply, creating a current.

7. The device of claim 5, wherein:
   the at least one negative input comprises two negative inputs;
   the input signal comprises a positive component having a positive component voltage and a negative component having a negative component voltage; and
   the positive component and the negative component are each input into one of the two negative inputs.

8. The device of claim 5, wherein a current at the first node is equal to a current at the second node.

9. The device of claim 7, wherein:
a change in a voltage of the input signal creates a first change in a voltage at the first node;
the first change in the voltage at the first node creates an change in a current across the seventh transistor;
the change in current across the seventh transistor creates a second change in voltage at the first node, the second change being made until the voltage at the first node is to equal the voltage at the second node;
the second change in voltage at the first node creating a change in current across the first transistor;
the change in current across the first transistor creating a change in voltage at the common mode output.

10. The device of claim 9, wherein the voltage at the common mode output is changed until the voltage at the common mode output is equal to $$\left(\frac{V_{Input+} + V_{Input-}}{2}\right), V_{Input+}$$

being the positive component voltage and $V_{Input-}$ being the negative component voltage.

11. The device of claim 6, wherein the first, second, third, fourth, fifth, sixth, seventh, eighth, ninth, and tenth transistors comprise field effect transistors (FETs).

12. The device of claim 11, wherein:
the first transistor, the ninth transistor, and the tenth transistor comprise p-type FETs; and
the second transistor, the third transistor, the fourth transistor, the fifth transistor, the sixth transistor, the seventh transistor, and the eighth transistor comprise n-type FETs.

13. The device of claim 1, wherein the device does not contain any resistors.

14. The device of claim 1, wherein the device comprises a circuit which may be integrated into a larger integrated circuit, while only occupying a small die area of the integrated circuit.

* * * * *